US008928143B2

(12) United States Patent
Yamazaki

(10) Patent No.: US 8,928,143 B2
(45) Date of Patent: Jan. 6, 2015

(54) SEMICONDUCTOR DEVICE AND METHOD OF MANUFACTURING THE SAME

(75) Inventor: Kazuo Yamazaki, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 86 days.

(21) Appl. No.: 13/244,369

(22) Filed: Sep. 24, 2011

(65) Prior Publication Data

US 2012/0012910 A1 Jan. 19, 2012

Related U.S. Application Data

(62) Division of application No. 12/356,844, filed on Jan. 21, 2009, now Pat. No. 8,053,360.

(30) Foreign Application Priority Data

Jan. 22, 2008 (JP) ................. 2008-011532

(51) Int. Cl.
| | |
|---|---|
| H01L 23/48 | (2006.01) |
| H01L 23/52 | (2006.01) |
| H01L 29/40 | (2006.01) |
| H01L 27/108 | (2006.01) |
| H01L 21/768 | (2006.01) |
| H01L 23/485 | (2006.01) |

(52) U.S. Cl.
CPC .... *H01L 21/76831* (2013.01); *H01L 27/10814* (2013.01); *H01L 27/10885* (2013.01); *H01L 21/76883* (2013.01); *H01L 23/485* (2013.01)
USPC .................................. 257/751; 257/E23.001

(58) Field of Classification Search
CPC ................... H01L 21/76846; H01L 23/53238
USPC ................... 257/E21.495, E21.658, E21.657, 257/E27.088, E21.84, E21.585, 774, 751, 257/773, E23.001; 438/629, 637, 652, 653, 438/672, 675, 773
See application file for complete search history.

(56) References Cited

U.S. PATENT DOCUMENTS

| | | | |
|---|---|---|---|
| 5,714,804 A | 2/1998 | Miller et al. | |
| 5,807,786 A * | 9/1998 | Chang | 438/600 |
| 6,187,672 B1 | 2/2001 | Zhao et al. | |
| 6,251,790 B1 | 6/2001 | Jeong | |
| 6,638,775 B1 * | 10/2003 | Kweon | 438/3 |
| 6,794,304 B1 * | 9/2004 | Gu et al. | 438/740 |
| 6,884,715 B1 | 4/2005 | Kwon et al. | |
| 7,361,591 B2 | 4/2008 | Park | |
| 7,728,375 B2 | 6/2010 | Shin et al. | |

(Continued)

FOREIGN PATENT DOCUMENTS

| | | |
|---|---|---|
| JP | 5-283536 A | 10/1993 |
| JP | 8-236626 A | 9/1996 |
| JP | 2000-299437 A | 10/2000 |
| JP | 2000-340743 A | 12/2000 |
| JP | 2001-284353 A | 10/2001 |
| JP | 2002-523899 A | 7/2002 |
| JP | 2002-231906 A | 8/2002 |
| JP | 2002-313955 A | 10/2002 |
| JP | 2003-7854 A | 1/2003 |
| JP | 2004-23098 A | 1/2004 |
| JP | 2005-039189 A | 2/2005 |
| JP | 2005-72176 A | 3/2005 |
| JP | 2009-27171 A | 2/2009 |

*Primary Examiner* — William F Kraig
*Assistant Examiner* — Latanya N Crawford
(74) *Attorney, Agent, or Firm* — Sughrue Mion, PLLC

(57) ABSTRACT

To prevent two contacts that have different heights, share at least one interlayer insulating film and are disposed close to each other from being short-circuited to each other due to misalignment thereof, a semiconductor device according to the invention has a recess in an interlayer insulating film in which a first contact having a lower height, the recess being formed by the upper surface of the first contact, and a silicon nitride sidewall is formed in the recess to extend from the upper surface of the first contact and along the side surface of the recess.

22 Claims, 6 Drawing Sheets

(56) References Cited

U.S. PATENT DOCUMENTS

| | | |
|---|---|---|
| 2002/0146899 A1 | 10/2002 | Chun |
| 2003/0214022 A1 | 11/2003 | Yang et al. |
| 2006/0040465 A1* | 2/2006 | Southwick et al. ........... 438/430 |
| 2007/0202677 A1* | 8/2007 | Mathew et al. ............... 438/597 |
| 2007/0224758 A1 | 9/2007 | Park |
| 2007/0267751 A1* | 11/2007 | Yang et al. ................... 257/758 |
| 2008/0003866 A1 | 1/2008 | Bae et al. |
| 2008/0048168 A1* | 2/2008 | Sato ................................. 257/3 |
| 2008/0061334 A1* | 3/2008 | Jung et al. ..................... 257/295 |
| 2008/0157093 A1* | 7/2008 | Cho et al. ........................ 257/71 |
| 2009/0032954 A1 | 2/2009 | Kim |
| 2009/0085083 A1 | 4/2009 | Shin |
| 2009/0321931 A1 | 12/2009 | Lee et al. |
| 2010/0022086 A1* | 1/2010 | Choi et al. .................... 438/653 |
| 2010/0210087 A1 | 8/2010 | Sung et al. |

\* cited by examiner

SEMICONDUCTOR DEVICE AND METHOD OF MANUFACTURING THE SAME

CROSS REFERENCE TO RELATED APPLICATIONS

This application is a divisional application of U.S. application Ser. No. 12/356,844 filed Jan. 21, 2009, which claims priority from Japanese Patent Application No. 2008-011532 filed Jan. 22, 2008, which applications are incorporated herein by reference.

BACKGROUND OF THE INVENTION

1. Field of the Invention

The present invention relates to a semiconductor device and a method of manufacturing the same. In particular, it relates to a structure of a device, such as a memory cell, that includes a capacitor contact and a bit contact disposed close to each other in which a short circuit between the contacts is prevented, and a method of manufacturing the same.

2. Related Art

Memory cells used in semiconductor devices, such as DRAM, include a memory cell transistor and a capacitor. As a memory device with high integration density, a Capacitor Over Bit-line (COB) type DRAM has been proposed in which capacitors are disposed in a layer above bit lines.

FIG. 11 is a cross-sectional view of a part of such a COB-type DRAM. Bit contact 12 and capacitor contact 13 are connected to respective cell contacts 11 connected to cell transistors (not shown), and bit line 14 is disposed on bit contact 12. Capacitor contact 13 extends into an upper insulating layer that covers bit line 14 and is connected to a capacitor that includes lower electrode 15, capacitor dielectric film 16 and upper electrode 17.

To prevent a short circuit between a bit line and a capacitor contact, there has been proposed a method of forming a nitride sidewall on the side of the bit line in a self-alignment manner (see Japanese Patent Laid-Open Nos. 2002-231906 and 2003-7854). Alternatively, in Japanese Patent Laid-Open No. 2005-39189, there is proposed a method of preventing a short circuit between a bit line and a capacitor contact by covering both the bit line and the bit contact with a direct nitride film.

On the other hand, based on a different idea, there has been proposed a structure in which a nitride film surrounding an upper part of a bit contact is formed, which is manufactured by partially forming a contact hole for a bit contact, forming a sidewall nitride film on the inner surface of the partially formed contact hole, using the sidewall nitride film as a mask to complete the contact hole having a reduced diameter that extends to the lower structure, filling the contact hole with a conductive material, and planarizing the conductive material by CMP or the like to form the bit contact (Japanese Patent Laid-Open No. 2000-299437).

With the advance of miniaturization of the semiconductor device, the problem of a short circuit between a bit line and a capacitor contact is becoming more serious, and the short-circuit margin between the capacitor contact and the bit contact is decreasing. However, from the viewpoint of ensuring adequate electrical connection, it is not wise to reduce the diameter of the contacts. In addition, considering that alignment is performed on the upper layer, the contacts preferably have larger diameters in upper parts than in lower parts.

Thus, if misalignment of a capacitor contact occurs, the top part of the bit contact, which has the largest diameter, and the capacitor contact are short-circuited. As shown in FIG. 12(a), the top part of bit contact 22 and capacitor contact 23 are in contact with each other and thus short-circuited. FIG. 12(b) is a top view, in which reference numeral 24 denotes a bit line, reference numeral 25 denotes the top surface of bit contact 22, and reference numeral 26 denotes the top surface of capacitor contact 23. FIG. 12(a) is a cross-sectional view taken along the line A-A in FIG. 12(b), in which reference numeral 21 denotes a cell contact. In FIG. 12(a), illustration of the bit line, a capacitor and a cell transistor is omitted.

As disclosed in Japanese Patent Laid-Open No. 2005-39189, a short circuit can be prevented by covering both the bit line and the bit contact with a nitride film. However, to cover the bit contact with a nitride film, the interlayer insulating film covering the bit contact has to be previously removed. Furthermore, in the case of a contact that has a larger diameter in an upper part thereof as shown in FIGS. 12(a) and 12(b), the contact covered with a nitride film is increased in diameter in a lower part thereof, so that there is a possibility that the upper surface of the cell contact in the lower layer that is to be connected to the capacitor contact is partially covered in such a miniaturized structure, and the contact resistance of the capacitor contact increases.

Thus, there is a demand for a structure of a semiconductor device having a miniaturized cell structure or the like in which a short circuit between two contacts that have different heights and are disposed close to each other, such as a bit contact and a capacitor contact, due to a misalignment thereof is prevented without increasing the contact resistance of the capacitor contact.

SUMMARY

The present invention seeks to solve one or more of the above problems, or to improve upon those problems at least in part.

In one embodiment, there is provided a semiconductor memory device that includes at least a first contact and a second contact having a larger height than the first contact that share at least one interlayer insulating film and are disposed close to each other, wherein the upper surface of the first contact is lowered from the upper surface of an interlayer insulating film, in which the first contact is formed, to form a recess, and a silicon nitride sidewall extends in the recess from the upper surface of the first contact and along the side surface of the recess.

In another exemplary embodiment, there is provided a method of manufacturing a semiconductor device that includes at least a first contact and a second contact having a larger height than the first contact that share at least one interlayer insulating film and are disposed close to each other, comprising:

etching back the upper surface of the first contact to form a recess in an interlayer insulating film in which the first contact is formed; and forming a silicon nitride film in the recess and etching back the silicon nitride film to form a sidewall that extends from the upper surface of the first contact and along the side surface of the recess.

According to the these embodiments, even if the capacitor contact is formed close to an upper edge of the bit contact, the silicon nitride film blocks etching, so that a short circuit between the capacitor contact and the bit contact is prevented.

BRIEF DESCRIPTION OF THE DRAWINGS

The above features and advantages of the present invention will be more apparent from the following description of certain preferred embodiments taken in conjunction with the accompanying drawings, in which

FIG. 12(*b*) is a schematic plan view showing the situation.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Figure 1:
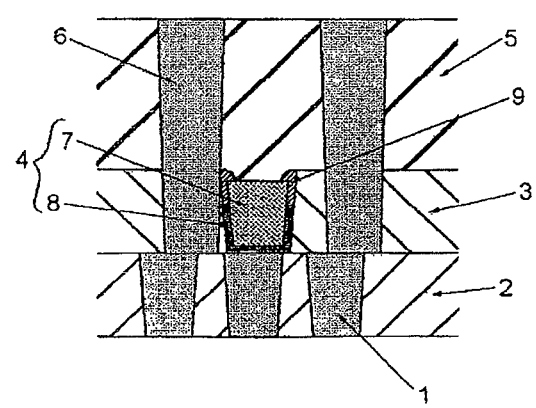
FIG. 1 is a schematic cross-sectional view of an apparatus that prevents a short circuit between a capacitor contact and a bit contact according to an exemplary embodiment.

A semiconductor device according to an exemplary embodiment is a semiconductor memory device, such as DRAM, shown in FIG. 1 and in a cell transistor part, bit contact 4 and capacitor contact 6 are adjacent to each other, a recess above bit contact 4 is formed in interlayer insulating film 3 in which bit contact 4 is formed, and silicon nitride sidewall 9 covering the side surface of the recess extends from the upper surface of bit contact 4. This drawing shows an example in which bit contact 4 comprises barrier film 8 and bit metal film 7. Reference numeral 1 denotes a cell contact to a cell transistor formed in a lower layer (not shown), reference numerals 2, 3 and 5 denote an interlayer insulating film. In this exemplary embodiment, bit contact 4 serves as the first contact, and capacitor contact serves as the second contact. Bit contact 4 and capacitor contact 6 share interlayer insulating film 3. Illustration of a bit line is omitted.

As shown in this drawing, since silicon nitride sidewall 9 is formed on the upper part of the edge surface of bit contact 4, even in a case where an edge of bit contact 4 would otherwise be etched in formation of the capacitor contact, silicon nitride sidewall 9 functions as an etching stopper, so that bit contact 4 is prevented from being exposed. As a result, a short circuit between bit contact 4 and capacitor contact 6 is prevented.

Next, exemplary embodiments will be described.

First Exemplary Embodiment

According to a first exemplary embodiment, after a bit contact hole is formed, a TiN/Ti barrier film and a W film are buried in the bit contact hole, and then the TiN/Ti barrier film and the W film are polished by CMP, thereby forming a bit contact. Then, the bit contact is etched back by dry etching to form a recess structure in which the upper surface of the bit contact is recessed. In this process, the TiN/Ti barrier film surrounding the W plug is selectively etched so that the level of upper surface of the TiN/Ti barrier film is lower than that of the W plug. Then, a silicon nitride film is formed over the entire surface and then etched back so that a silicon nitride sidewall extending from the upper surface of the bit contact and covering the side surface of the recess structure is formed.

In the following, a manufacturing method according to the first exemplary embodiment will be described with reference to FIGS. 2 to 9.

Figure 2:
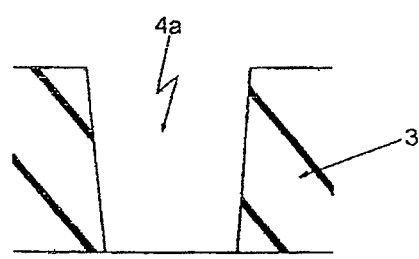
FIGS. 2 to 9 are schematic cross-sectional views showing different steps in a method of manufacturing a semiconductor device according to an exemplary embodiment.

First, to form a bit contact, interlayer insulating film (silicon oxide film) 3 is etched to form contact hole 4a that exposes to the upper surface of a base cell contact (not shown) (FIG. 2).

Figure 3:
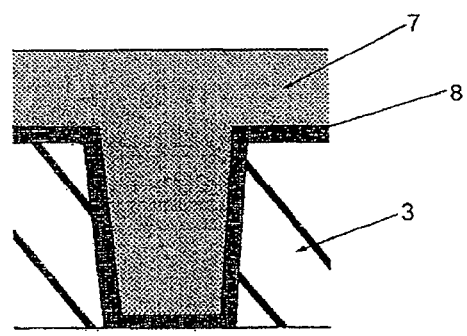

Then, a TiN film and a Ti film serving as barrier film 8 are formed. The Ti film is deposited by chemical vapor deposition (CVD) using $TiCl_4$, and the TiN film is deposited by CVD using $TiCl_4$ and $NH_3$. Then, tungsten (W) film 7 is formed. W film 7 is deposited by CVD using $WF_6$ and $H_2$ (FIG. 3).

Figure 4:
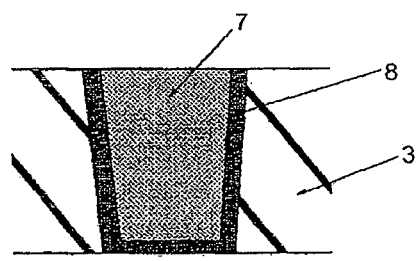
Figure 5:
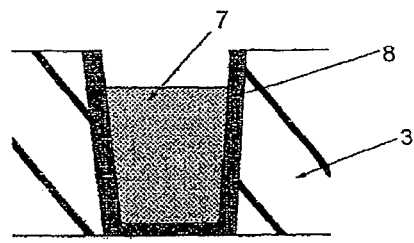

Then, CMP is performed to planarize the surface to form a plug (FIG. 4). At this point in time, the upper surface of the plug is flush with the upper surface of interlayer insulating film 3. Thus, then, the level of the upper surface of W film 7 and TiN/Ti barrier film 8 is lowered. W film 7 and TiN/Ti barrier film 8 are etched back by dry etching to form a recess. W film 7 is etched using a fluorine-based gas, and TiN/Ti barrier film 8 is etched using a chlorine-based gas. Since W film 7 is not substantially etched by the chlorine-based gas, and TiN/Ti barrier film 8 is not substantially etched by the fluorine-based gas, W film 7 and TiN/Ti barrier film 8 can be independently and selectively etched with high controllability. For example, etching of W film 7 involves an electron cyclotron resonance (ECR) etcher, $CF_4/O_2/N_2$ as a process gas, a pressure of 1.33 Pa (10 mTorr), a microwave power of 800 W and an RF power of 30 W. To lower the upper surface of the W plug by 40 nm, supposing that the etching rate for W is 100 nm/min, the etching can be performed for about 25 seconds. However, the fluorine-based gas can also etch interlayer insulating film 3, which is a silicon oxide film, and therefore, the etching conditions are preferably adjusted to increase the selectivity to the oxide film by decreasing the RF power, for example (FIG. 5).

Figure 6:
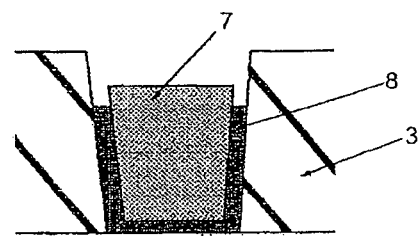

On the other hand, for example, etching of the TiN/Ti barrier film involves the ECR etcher, $BCl_3/Cl_2$ as a process gas, a pressure of 1.33 Pa (10 mTorr), a microwave power of 800 W and an RF power of 30 W. To lower the upper surface of the TiN/Ti barrier film by 80 nm, supposing that the etching rate for TiN/Ti is 100 nm/min, the etching can be performed for about 50 seconds. The chlorine-based gas can hardly etch interlayer insulating film 3, and therefore, a high selectivity to the oxide film can be achieved. In addition, the W film is also unlikely to be etched (FIG. 6).

Figure 7:
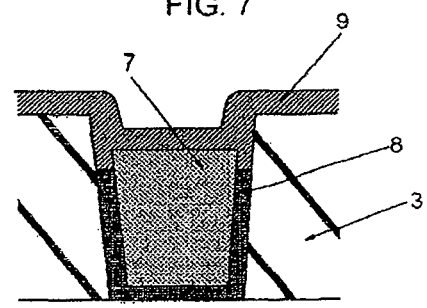
Figure 8:
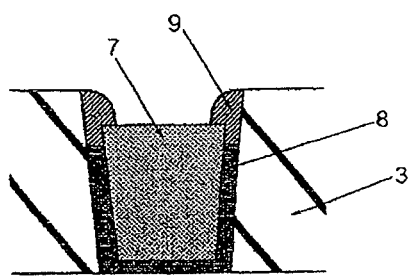

Then, silicon nitride film 9 is formed by CVD (FIG. 7). The thickness of silicon nitride film 9 is the lateral length of the sidewall to be formed later. For example, silicon nitride film 9 is formed to a thickness of 40 nm, for example, using $SiH_2Cl_2$ as a process gas, under a pressure of 133 Pa (1 Torr) and at a temperature of 680° C.

Then, the silicon nitride film is etched back to form a sidewall. The etch back of the silicon nitride film is dry etching and involves a parallel plate type etcher, $CF_4/CHF_3/Ar/O_2$ as a process gas, a pressure of 40 mTorr and an RF power of 250 W, for example. Although the etching of the W film and the TiN/Ti barrier film described above is half etching, so that end point detection is impossible, the end point of the etching of the silicon nitride film can be detected using plasma emission. Typically, the end point detection of the etching is performed by detecting light emission of SiF (at 440 nm). In this way, a sidewall extending along the sidewall of the bit contact and the upper edge of the contact can be formed.

Figure 9:
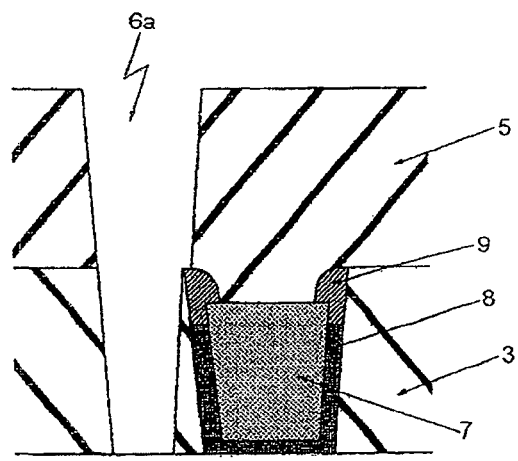

Then, a bit line is formed (not shown), interlayer insulating film (silicon oxide film) 5 is formed, and capacitor contact hole 6a is formed in interlayer insulating film 5. Even in a case where patterning of the capacitor contact involves a significant misalignment, an edge of the bit contact would otherwise be etched in etching to form the capacitor contact hole, the sidewall silicon nitride film 9 blocks the etching (etching of the oxide film to form the capacitor contact hole is performed under etching conditions including a high selectivity to the silicon nitride film), and therefore, a short circuit between the capacitor contact and the bit contact is prevented (FIG. 9).

Since the silicon nitride sidewall is formed along the sidewall and upper edge of the bit contact in this way, even if the capacitor contact is disposed close to an upper edge of the bit contact due to a misalignment in formation of the capacitor contact, the silicon nitride film blocks etching, so that a short circuit between the capacitor contact and the bit contact is prevented.

Consider a case where the W plug is etched back by 40 nm, and the silicon nitride film to form the sidewall is deposited to a thickness of 40 nm. Supposing that the depth of the bit contact is 180 nm, the amount of over etching of the capacitor contact is 50 nm, and the etching rate ratio between the oxide film and the silicon nitride film is 10, the thickness of the removed silicon nitride film is 23 nm. Since the initial height of the silicon nitride film sidewall is 40 nm, the thickness of the remaining silicon nitride film is 17 nm, and thus, a short circuit is prevented.

Since the silicon nitride sidewall is formed by etching back the TiN/Ti barrier film on the sidewall of the bit contact, no short circuit to the capacitor contact occurs also on the side surface of the bit contact. For example, in a case where the TiN film has a thickness of 15 nm, and the Ti film has a thickness of 10 nm, the silicon nitride film formed on the side surface of the bit contact has a thickness of 25 nm, which is a sufficient short-circuit margin.

If the W plug is excessively etched back, the bit line formed later experiences a large difference in height at the bit contact and thus can be broken at that part. Thus, the W plug is preferably etched back by an amount of about 30 to 60 nm. Furthermore, if the TiN/Ti barrier film is etched back to the bottom of the bit contact, an abnormal shape can occur. Thus, taking the controllability into account, the TiN/Ti barrier film is preferably etched back by an amount of about 30 nm to a half of the depth of the bit contact.

Second Exemplary Embodiment

In the exemplary embodiment described above, the W plug is formed by CMP. In the following, a method of etching back the W plug by dry etching, rather than using CMP, will be described.

Figure 10:
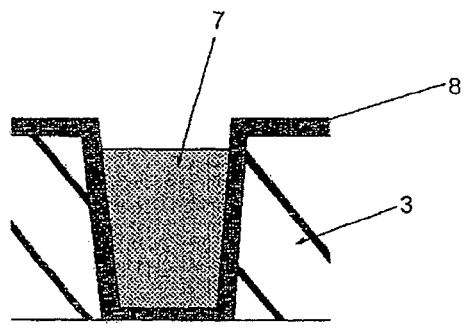
FIG. 10 is a schematic cross-sectional view showing a step in a method of manufacturing a semiconductor device according to another exemplary embodiment.
Figure 11:
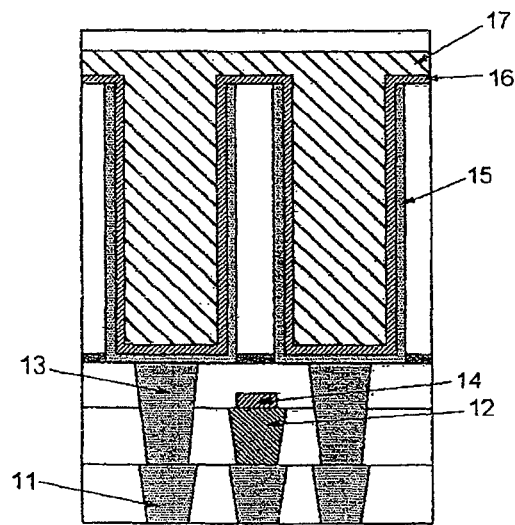
FIG. 11 is a schematic cross-sectional view of a semiconductor memory device having a typical COB structure.
Figure 12A:
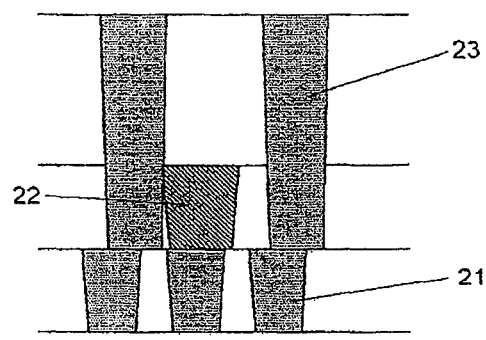
FIG. 12(*a*) is a schematic cross-sectional view for illustrating a situation in which a capacitor contact and a bit contact are short-circuited.
Figure 12B:
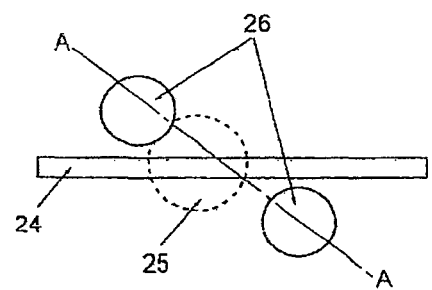

First, after barrier film 8 and W film 7 are buried in the bit contact hole as shown in FIG. 3, W film 7 is etched back under the same conditions as described above. In this process, based on the emission spectrum, the end point of the etching can be detected when TiN/Ti barrier film 8 is exposed on flat interlayer insulating film 3 at a part other than the part in which the bit contact is to be formed. Furthermore, over etching is performed to lower the upper surface of the W plug to a desired level (FIG. 10). Since the TiN/Ti barrier film is not substantially etched under the etching conditions for the W film, the TiN/Ti barrier film is then etched (under the same etching conditions as described in the first exemplary embodiment). Since the oxide film and the W film are not substantially etched under the etching conditions for the TiN/Ti barrier film, the TiN/Ti can be etched with high shape controllability. As a result, a structure in which barrier film 8 is retracted as shown in FIG. 6 is formed. Then, a sidewall can be formed in the same manner as described above.

Prevention of a short circuit between a capacitor contact and a bit contact has been described as an example. However, the present invention can be applied to all the semiconductor devices having a structure in which a contact has to be formed by preventing a short circuit to another contact in a lower layer.

It is apparent that the present invention is not limited to the above embodiments, but may be modified and changed without departing from the scope and spirit of the invention.

What is claimed is:

1. A semiconductor device comprising:
an insulating film;
a contact hole penetrating the insulating film;
a barrier film on a bottom surface and an inner side surface of the contact hole, the barrier film having an upper surface;
a metal plug inside the contact hole, the metal plug being disposed on the barrier film in the contact hole, the metal plug having an upper surface, the upper surface of the metal plug in the contact hole being formed at a higher level than the upper surface of the barrier film in the contact hole; and
an insulating sidewall, the insulating sidewall being disposed along an upper side of the contact hole, and in contact with the metal plug and the barrier film,
wherein the insulating sidewall covers a part of the upper surface of the metal plug and does not cover an entire upper surface of the metal plug.

2. The semiconductor device according to claim 1, wherein the insulating sidewall comprises a silicon nitride film.

3. The semiconductor device according to claim 1, further comprising a memory cell transistor and a capacitor, wherein the capacitor is disposed in a layer above a bit line, a bit contact connected to the bit line is disposed in the contact hole, and a capacitor contact connected to the capacitor is disposed in another contact hole.

4. The semiconductor device according to claim 1, wherein a depth from a surface of the insulating film to the upper surface of the metal plug is 30 to 60 nm.

5. The semiconductor device according to claim 1, wherein a depth from a surface of the insulating film to the upper surface of the barrier film is equal to or more than 30 nm and equal to or less than a half of a depth of the first contact hole formed in the insulating film.

6. The semiconductor device according to claim 1, wherein the barrier film comprises TiN, and the metal plug comprises tungsten.

7. The semiconductor device according to claim 1, wherein a width of the insulating sidewall from the upper surface of the contact hole to the sidewall edge is equal to or more than 20 nm and equal to or less than a quarter of a diameter of the top of the contact hole.

8. The semiconductor device according to claim 1, wherein a diameter of the top of the contact hole is larger than a diameter of the bottom of the contact hole.

9. A semiconductor device comprising:
an insulating film;
a first contact hole penetrating the insulating film;
a barrier film on a bottom surface and an inner side surface of the first contact hole;
a metal plug inside the first contact hole, the metal plug being disposed on the barrier film in the first contact hole;
an insulating sidewall, the insulating sidewall being disposed along an upper side of the contact hole, and in contact with the metal plug and the barrier film; and
a second contact hole penetrating the insulating film, a part of the insulating sidewall being exposed in the second contact hole, and both the barrier film and the metal plug being not exposed in the second contact hole.

10. The semiconductor device according to claim 9, wherein an upper surface of the metal plug in the first contact hole being formed at a higher level than an upper surface of the barrier film in the first contact hole.

11. The semiconductor device according to claim 9, further comprising a memory cell transistor and a capacitor, wherein the capacitor is disposed in a layer above a bit line, a bit contact connected to the bit line is disposed in the first contact hole, and a capacitor contact connected to the capacitor is disposed in the second contact hole.

12. The semiconductor device according to claim 9, wherein the barrier film comprises TiN, and the metal plug comprises tungsten.

13. A semiconductor device comprising:
a first insulating film;
a plug formed in the first insulating film, the plug having a first upper surface and a second upper surface, the first upper surface being lowered from an upper surface of the first insulating film, the second upper surface being lowered from the first upper surface and being provided between the first insulating film and the first upper surface so that a recess is provided between the first insulation film and the first upper surface; and
an insulating sidewall covering the second upper surface, a portion of the first upper surface and the first insulating film exposed by the recess,
wherein a first vertical thickness of the insulating sidewall at a first point on the first upper surface is smaller than a second vertical thickness of the insulating sidewall at a second point on the first upper surface, the second point being nearer to the first insulating film exposed by the recess compared with the first point.

14. The semiconductor device according to claim 13, further comprising:
a first contact formed in the first insulating film, the first contact comprising the plug, the insulating sidewall and the recess;
a second insulating film formed over the first insulating film; and
a second contact formed in the first and second insulating films, the second contact including a larger height than the first contact measured from a bottom surface of the first insulating film.

15. The semiconductor device according to claim 14, further comprising a bit line, a third insulating film and a capacitor, wherein the capacitor is disposed in the third insulating film above the bit line, the plug is connected to the bit line, and the second contact is connected to the capacitor.

16. The semiconductor device according to claim 13,
wherein the plug comprises a metal plug and a barrier film, and
wherein the metal plug comprises the first upper surface and the barrier film comprises the second upper surface.

17. The semiconductor device according to claim 16, wherein the barrier film comprises TiN, and the metal plug comprises tungsten.

18. The semiconductor device according to claim 13, wherein the insulating sidewall comprises a silicon nitride film.

19. The semiconductor device according to claim 13, wherein a depth from the upper surface of the first insulating film to the first upper surface of the plug is 30 to 60 nm.

20. The semiconductor device according to claim 13, wherein a depth of the recess over the second upper surface is more than 30 nm and equal to or less than a half of a depth of a first contact formed in the first insulating film.

21. The semiconductor device according to claim 14, wherein a diameter of the top of the first contact is larger than a diameter of the bottom thereof.

22. The semiconductor device according to claim 13, wherein the insulating sidewall does not cover an entire first upper surface of the plug.

* * * * *